United States Patent [19]

Hata

[11] Patent Number: 4,971,674

[45] Date of Patent: Nov. 20, 1990

[54] MAGNETRON SPUTTERING METHOD AND APPARATUS

[75] Inventor: Tomonobu Hata, Ishikawa, Japan

[73] Assignee: UBE Industries, Ltd., Yamaguchi, Japan

[21] Appl. No.: 345,678

[22] Filed: May 1, 1989

Related U.S. Application Data

[63] Continuation-in-part of Ser. No. 81,713, Aug. 4, 1987, abandoned.

[30] Foreign Application Priority Data

Aug. 6, 1986 [JP] Japan .................................. 61-183375
May 13, 1987 [JP] Japan .................................. 62-114412

[51] Int. Cl.$^5$ .............................................. C23C 14/35
[52] U.S. Cl. ........................ 204/192.120; 204/298.200
[58] Field of Search ................ 204/192.12, 298 MM, 204/298 PM, 298 ME, 298 FP, 298.2

[56] References Cited

U.S. PATENT DOCUMENTS

| | | | |
|---|---|---|---|
| 4,275,126 | 6/1981 | Bergmann et al. | 429/30 |
| 4,401,539 | 8/1983 | Abe | 204/192.12 |
| 4,444,635 | 4/1984 | Kobayashi et al. | 204/192.15 |
| 4,810,346 | 3/1989 | Wolf et al. | 204/298.12 |
| 4,865,710 | 9/1989 | Aaron et al. | 204/192.12 |

OTHER PUBLICATIONS

T. Hata et al., *Proceedings 15th Electrical Electronics Insulation Conference* (1981), pp. 314–317.

*Primary Examiner*—Aaron Weisstuch
*Attorney, Agent, or Firm*—Kane, Dalsimer, Sullivan, Kurucz, Levy, Eisele and Richard

[57] ABSTRACT

A magnetron sputtering apparatus is herein disclosed, the apparatus comprising a first solenoid coil for generating a first magnetic field, which is disposed on a back side of a sputtering target and a second solenoid coil for generating a second magnetic field which exerts influences on the first magnetic field, which is disposed in the vicinity of the outer periphery of the sputtering target, the magnitude and direction of each current applied to the first and second solenoid coils being changed to continuously move a plasma ring formed on the surface of the sputtering target towards the radial direction, to thus contact and expand the plasma ring; and the magnitude and direction of each current applied to the first and second solenoid coils being appropriately set to a desired value to hold the plasma ring at a desired location in the radial direction for a desired time period. When sputtering is performed using this apparatus, the location of the plasma ring formed on the target surface in the radial direction can effectively be controlled over a sufficiently wide region.

7 Claims, 17 Drawing Sheets

MAGNETRON SPUTTERING METHOD AND APPARATUS

BACKGROUND OF THE INVENTION

This application is a Continuation-In-Part of copending application Ser. No. 081,713 which was filed on Aug. 4, 1987, now abandoned.

1. Field of the Invention

The present invention relates to a method and an apparatus for magnetron sputtering which makes it possible to effectively control the variations of plasma residence time and location on a sputtering target by adjusting the magnetic field applied. The present invention can be applied to, for instance, the formation of a film of uniform thickness on a substrate having a large surface area or the formation of a multilayer film whose composition varies along the direction of its thickness utilizing a composite target consisting of a plurality of partial targets.

2. Prior Art

The apparatus and principle for depositing films by sputtering are relatively simple and have wide utility in various industrial and academic applications.

The sputtering method has been employed, for instance, for forming electrodes and wirings for semiconductor devices, for depositing oxide films and for forming magnetic films and protective films for magnetic record mediums.

There have been proposed various sputtering methods to apply them to the foregoing applications. One of such methods is a magnetron sputtering method.

As an example of such a magnetron sputtering apparatus, U.S. Pat. No. 4,444,635 discloses an apparatus in which two solenoid coils are coaxially arranged on a back side of a sputtering target.

In this apparatus, a central magnetic pole, an intermediate magnetic pole surrounding the central magnetic pole and an outer magnetic pole surrounding the intermediate magnetic pole are coaxially arranged, a first coil is disposed around the central magnetic pole and a second coil is disposed between the intermediate and outer magnetic poles. A current to be passed through the second coil is adjusted to properly establish the polarity of the outer pole and to thus form a plasma ring on a target in either a first region between the central magnetic pole and the intermediate magnetic pole or a second region between the intermediate and outer magnetic poles, while an electric current to be passed through the second coil is altered to switch the polarity of the outer magnetic pole to thus form the plasma ring in the other region.

However, the switching of the location of the plasma ring over the first region to the second region in this apparatus is carried out by gradually contracting and extinguishing the plasma formed in one region and freshly generating a plasma in the other region and growing it therein. As explained above, this apparatus prevents the movement of the plasma between these two regions by disposing an intermediate magnetic pole, but is not designed so that a plasma ring is continuously moved towards the radial direction. For this reason, the residence location of the plasma ring is greatly restricted to a limited range and thus the plasma cannot suitably be controlled over a sufficiently wide range on a sputtering target.

Incidentally, in the magnetron sputtering method, the thickness distribution of films formed on a substrate has a close correlation with the location of a plasma ring on a target in the radial direction. For this reason, it is general to change the distance between a substrate and target for achieving a uniform thickness distribution of films formed on the substrate and, therefore, in the apparatus disclosed in U.S. Pat. No. 4,444,635, such a method should be adopted to obtain a uniform distribution of film thickness. However, in such a method, a gas pressure change is caused and, as a result, it is difficult to perform a stable film formation.

Alternatively, Japanese Patent Un-examined Publication (hereinafter referred to as "J.P. KOKAI") Nos. Sho 57-207173 and Sho 58-171569 disclose apparatuses for magnetron sputtering which comprise a permanent magnet mounted on the center of a back side of a sputtering target and a solenoid coil disposed at the periphery of the target. In such apparatuses, the location of a plasma ring formed on the surface of a target is controlled by adjusting a current to be passed through the solenoid coil.

In these apparatuses, the permanent magnet alone is disposed at the center of the target and the magnetic field is simply controlled by the solenoid coil disposed at the periphery of the target. Thus, the movement of the plasma ring is restricted to a limited range and hence the plasma ring residence location cannot properly be controlled over a sufficiently wide range.

SUMMARY OF THE INVENTION

An object of the present invention is to provide a method for magnetron sputtering and an apparatus therefor, which makes it possible to control the location of a plasma formed on the surface of a target over a sufficiently wide area.

Consequently, according to an aspect of the present invention, there is provided an apparatus for magnetron sputtering comprising a first solenoid coil for generating a first magnetic field, which is disposed on a back side of a sputtering target and a second solenoid coil for generating a second magnetic field which exerts influences on the first magnetic field, which is disposed in the vicinity of the outer periphery of the sputtering target, the magnitude and direction of each current applied to the first and second solenoid coils being changed to continuously move a plasma ring formed on the surface of the sputtering target towards the radial direction, to thus contract and expand the ring; and the magnitude and direction of each current applied to the first and second solenoid coils being appropriately set to a desired value to hold the plasma ring at a desired location in the radial direction for a desired time period.

Moreover, according to the present invention, there are provided:

A method for magnetron sputtering which comprises using a single target as the sputtering target in the apparatus for magnetron sputtering described above; controlling a current to be applied to the first solenoid coil and/or the second solenoid coil to continuously move a plasma ring between a plurality of locations in the radial direction and appropriately setting the residence time of the plasma ring at each location in the radial direction to make the thickness distribution of films formed on a substrate uniform;

A method for magnetron sputtering which comprises using a target comprising a plurality of partial targets concentrically arranged as the sputtering target in the apparatus for magnetron sputtering described above;

controlling a current to be applied to the first solenoid coil and/or the second solenoid coil to hold a plasma ring on the surface of each partial target for a time sufficient to form desired layers to thus form a multilayer film on a substrate;

A method for magnetron sputtering which comprises using a target comprising a plurality of partial targets concentrically arranged as the sputtering target in the apparatus for magnetron sputtering described above; controlling a current to be applied to the first solenoid coil and/or the second solenoid coil to position a plasma ring on the surface of the sputtering target extending over two of the partial targets and gradually moving the plasma ring so as to obtain films, on a substrate, having a composition which gradually varies along the thicknesswise direction of the film formed;

A method for magnetron sputtering which comprises using a target comprising a plurality of partial targets concentrically arranged as the sputtering target in the apparatus for magnetron sputtering described above; controlling a current to be applied to the first solenoid coil and/or the second solenoid coil to repeatedly move a plasma ring back and forth on the surface of the two partial targets at a fast speed and gradually changing the ratio of the residence time of the plasma ring on the surface of these two partial targets to thus form, on a substrate, a film having a composition which gradually varies in the thicknesswise direction of the film formed;

A method for magnetron sputtering which comprises using a target comprising a plurality of partial targets concentrically arranged as the sputtering target in the apparatus for magnetron sputtering described above; controlling a current to be applied to the first solenoid coil and/or the second solenoid coil to repeatedly move a plasma ring back and forth on the surface of the two partial targets at a fast speed and stepwise changing the ratio of the residence time of the plasma ring on the surface of these two partial targets to thus form a multilayer film on a substrate; and A method for magnetron sputtering which comprises using a target comprising a plurality of partial targets concentrically arranged as the sputtering target in the apparatus for magnetron sputtering described above; controlling a current to be applied to the first solenoid coil and/or the second solenoid coil to repeatedly move a plasma ring back and forth on the surface of the two partial targets at a fast speed and keeping the ratio of the residence time of the plasma ring on the surface of these two partial targets constant to thus form, on a substrate, a uniform film composed of a plurality of components.

Thus, according to the present invention, the location of the plasma formed on the surface of the sputtering target can be controlled over a sufficiently wide range.

DETAILED DESCRIPTION OF THE INVENTION

Basic functions of the present invention will be explained below in detail with reference to the attached drawings.

FIGS. 1 to 4 are schematic diagrams illustrating magnetron electrodes of magnetron sputtering apparatuses.

Figure 1:
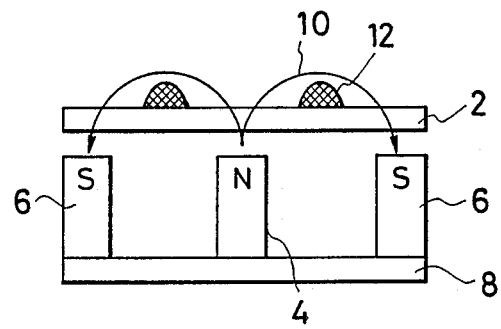
FIGS. 1 to 4 are schematic diagrams showing magnetron electrodes of a magnetron sputtering apparatus.

FIG. 1 is a schematic diagram showing the construction of a magnetron electrode of a conventional commonly used magnetron sputtering apparatus.

In FIG. 1, the reference numeral 2 represents a circular disk-like target which is horizontally disposed. A central magnetic pole 4 consisting of a permanent magnet is placed on the lower part (the back side) of the target at the center thereof and an outer magnetic pole 6 consisting of a ring-shaped magnetic substance is disposed at the outer periphery and the lower part of the target so as to surround the aforesaid central magnetic pole 4. The reference numeral 8 represents a connecting member consisting of a magnetic substance for connecting the central magnetic pole 4 and the outer magnetic pole 6. The central and outer magnetic poles 4 and 6 are magnetized so as to have polarities as shown in FIG. 1. The reference numeral 10 schematically denotes lines of magnetic force established by the central and outer magnetic poles. The reference numeral 12 shows a cross-sectional view of a ring-like plasma formed on the surface of the target 2 during discharging. In this respect, if one of the central and outer magnetic poles 4 and 6 is a permanent magnet, the other may be made from a magnetic substance, while if both of the central and outer magnetic poles 4 and 6 are permanent magnets, the foregoing connecting member 8 may be comprised of a non-magnetic material and further the polarities of the central and outer magnetic poles 4 and 6 may be opposite to one another.

When this magnetron electrode is used, the lines of magnetic force 10 cannot move and hence the plasma 12 formed cannot also move.

Figure 2:
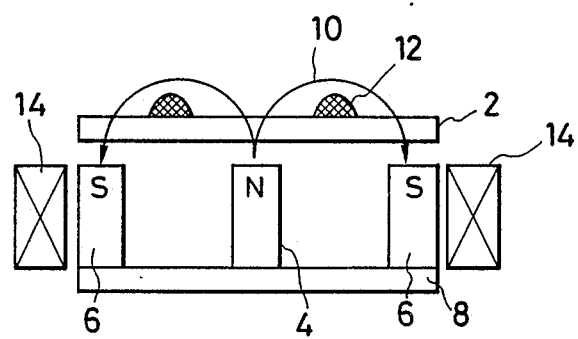

A magnetron electrode shown in FIG. 2 is the same as that shown in FIG. 1 except that a solenoid coil 14 is arranged in the vicinity of the outer side of the outer magnetic pole 6. According to this magnetic pole, the line of magnetic force 10 can be moved by changing the direction and magnitude of a current applied to the solenoid coil whereby the location of the plasma 12 in the radial direction can be controlled. This corresponds to a conventional apparatus as disclosed in the aforementioned J.P. KOKAI Nos. Sho 57-207173 and Sho 58-171569.

Figure 3:
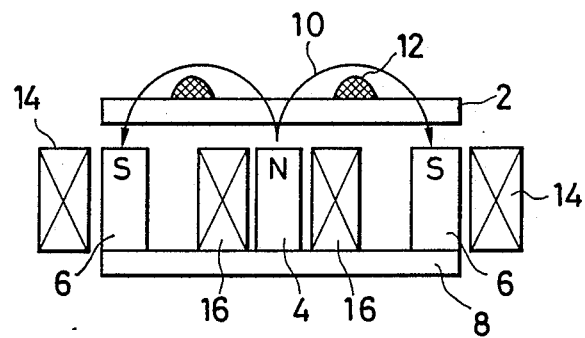

A magnetron electrode shown in FIG. 3 is the same as that shown in FIG. 2 except that a solenoid coil 16 is arranged at the periphery of the central magnetic pole 4. In this apparatus, the direction and the magnitude of a current to be applied to these two solenoid coils 14 and 16 can be changed to move the line of magnetic force 10 over a sufficiently wide range and to thus effectively adjust the location of the plasma 12 over a sufficiently wide region.

Figure 4:
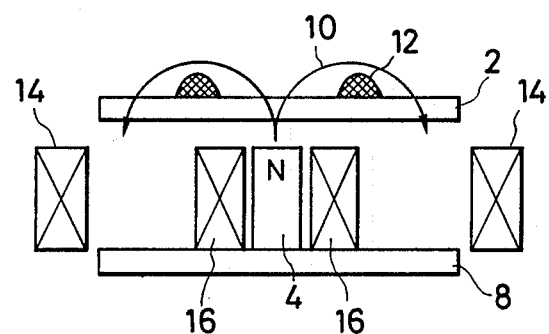

The magnetron electrode shown in FIG. 4 corresponds to that shown in FIG. 3 but in which the outer magnetic pole 6 is omitted. The magnetron electrode also makes it possible to satisfactorily control the location of the plasma like the electrode shown in FIG. 3.

The magnetron electrodes according to the present invention are those shown in FIGS. 3 and 4.

The difference in the plasma movement between those achieved by the electrodes shown in FIGS. 2 and 3 will now be explained below in detail.

Figure 5:
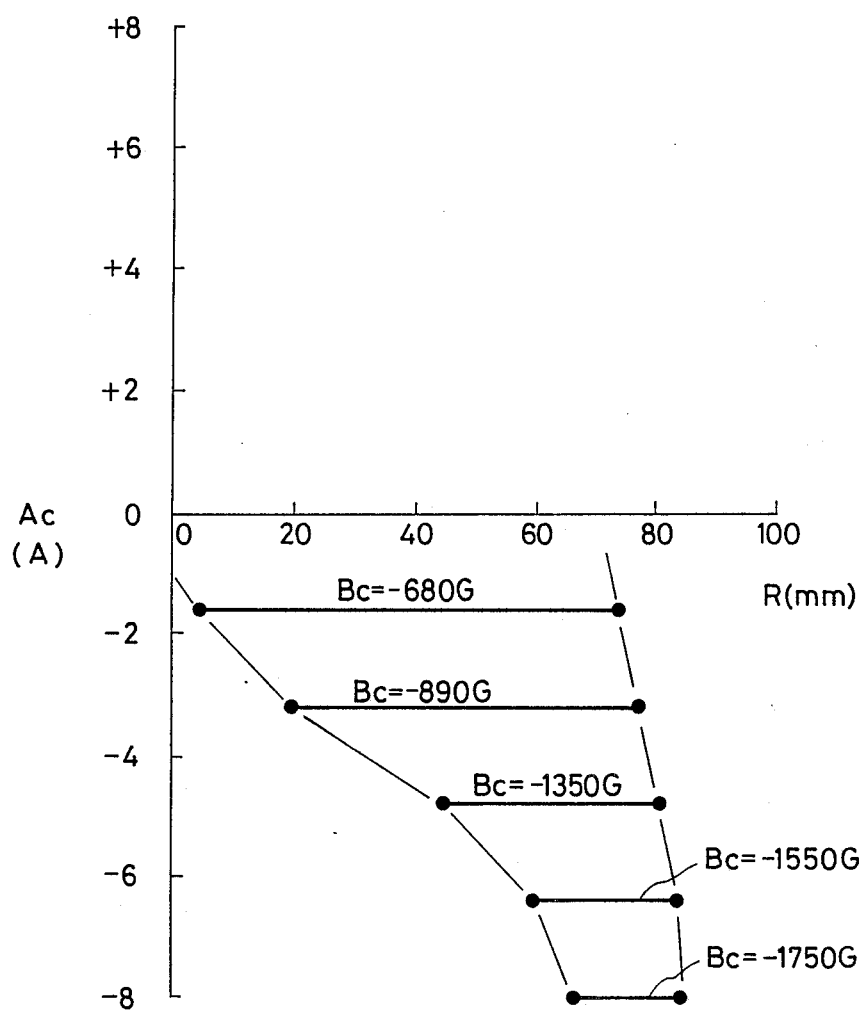
FIGS. 5 and 6 are diagrams showing the behavior of a plasma 12 observed when a current to be applied to solenoid coils 14 and 16 are changed in the apparatuses shown in FIGS. 2 and 3 respectively.
Figure 6:
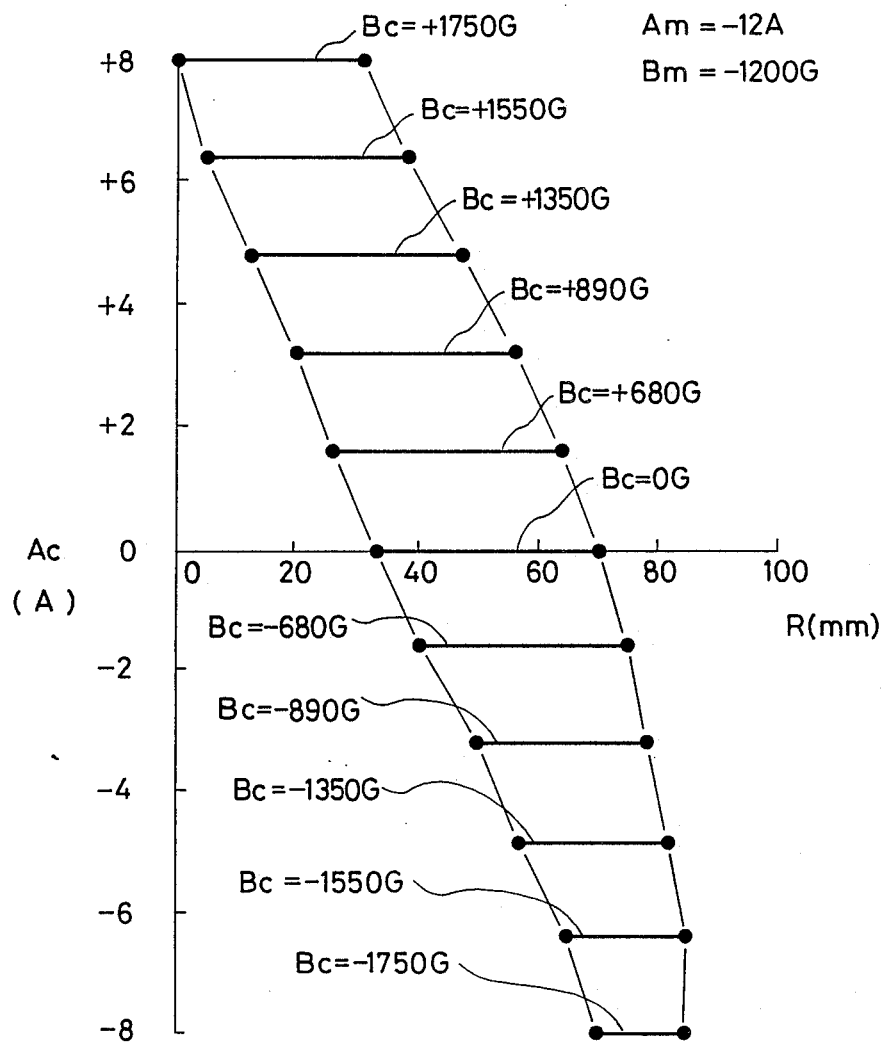

In the electrodes shown in FIGS. 2 and 3, the movement of the plasma 12 observed when the current applied to the solenoid coils 14 and 16 is changed becomes, for instance, as shown in FIGS. 5 and 6 respectively. These results are obtained under the following conditions: diameter of target 180 mm; gas pressure 10 mTorr; and discharge power 600 W. In these figures, R denotes the location of the plasma, in other words distance from the center of the target in the radial direction.

FIG. 5 shows the behavior of the plasma when the current Ac to be applied to the solenoid coil 14 of the electrode shown in FIG. 2 is altered. In this case, the location of the plasma corresponds to a region at which the target 2 is attacked and eroded with plasma 12 when it remains at rest for a desired residence time. The magnetic flux density (intensity of the magnetic field) on the central surface of the target due to the current Ac to be applied to the solenoid coil 14 is herein referred to as "magnetic field for compressing Bc". The downward direction of the magnetic field is referred to as "positive direction". In addition, the magnetic flux density (intensity of the magnetic field) on the central surface of the target due to the central magnetic pole 4 is herein referred to as "initial magnetic field Bo". The downward direction of the magnetic field is referred to as "positive direction". In this case, Bo is set to $-10,000$ G.

As seen from FIG. 5, even if Bc is changed from $-680$ G to $-1750$ G, radial movement of the outer periphery of the plasma 12 does not occur at all and when Bc is in the vicinity of zero G, the width of the plasma 12 is extremely great. Moreover, if Bc is positive, the requirements for the magnetron mode are not fulfilled and discharge is not caused at a voltage of not more than 1000 V.

On the other hand, FIG. 6 shows the behavior of the plasma observed when the electric current Ac to be applied to the solenoid coil 14 in FIG. 3 is likewise changed. The magnetic flux density (intensity of the magnetic field) on the central surface of the target due to the current Am to be applied to the solenoid coil 16 is herein referred to as "magnetron magnetic field Bm". The downward direction of the magnetic field is referred to as "positive direction". Am is herein selected to be $-12A$ and thus Bm is equal to $-1200$ G. In this respect, the initial magnetic field Bo is set to $-10,000$ G and the magnetic field for compressing Bc is changed as in the case shown in FIG. 5.

As seen from FIG. 6, if Bc is changed from $-1750$ G to $+1750$ G, the width of the plasma 12 remains sufficiently narrow in comparison with the case shown in FIG. 5 and the magnitude of the movement of the plasma is great. For instance, the plasma obtained at $Bc = +1550$ G and that formed at $Bc = -890$ G are not superposed upon one another. Therefore, if different partial targets are disposed at such locations and the location of the plasma is controlled, a single desired partial target can be utilized or both partial targets can be used alternatively so as to achieve a desired ratio of the residence time of the plasma.

Figure 7:
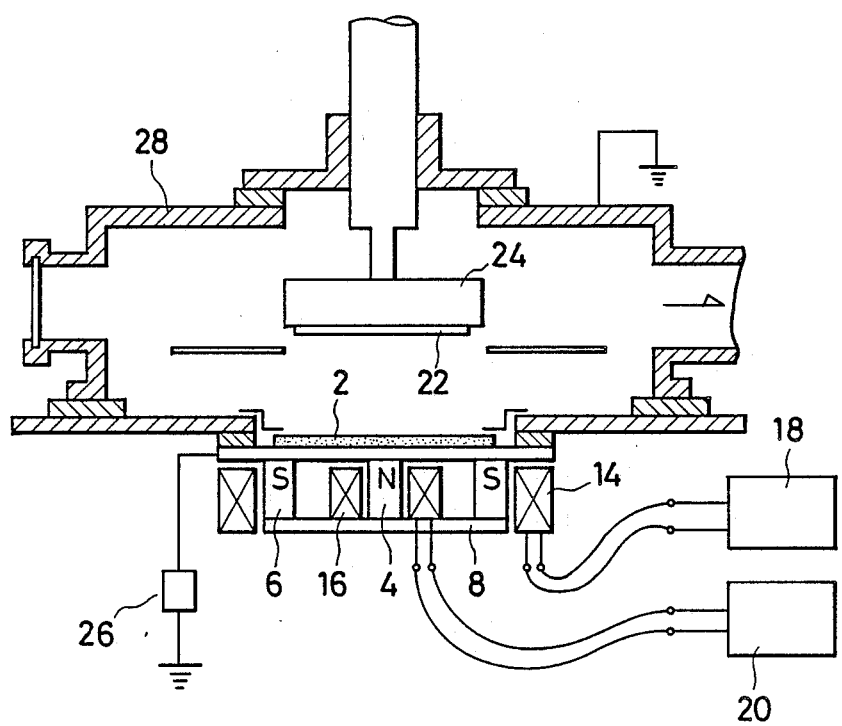
FIG. 7 is a diagram showing a specific construction of the sputtering apparatus according to the present invention in which the magnetron electrode shown in FIG. 3 is used.

As described above, the apparatus equipped with the magnetron electrode shown in FIG. 3 is superior in controllability of the plasma compared to the apparatus equipped with the magnetron electrode shown in FIG. 2. FIG. 7 is a diagram showing a specific construction of the sputtering apparatus provided with the magnetron electrode shown in FIG. 3 according to the present invention. In this figure, the reference numeral 2 denotes a target, 4 a central magnetic pole and 6 an outer magnetic pole. The reference numeral 16 represents a first solenoid coil placed around the central magnetic pole 4 and 14 a second solenoid coil disposed in the vicinity and the outer side of the target 2. The reference numerals 18 and 20 represent power supply means for applying a desired electric power to the solenoid coils 14 and 16 respectively. The reference numeral 22 denotes a substrate on which a film is formed, 24 a holder therefor, 26 a high voltage power supply for causing discharge and 28 a vacuum chamber.

FIG. 8 shows the location of the plasma 12 when Bm and Bc are properly set to predetermined values in the apparatus shown in FIG. 7. In this figure, the target 2 comprises a circular disk-like partial target A having a diameter of 180 mm, a ring-shaped partial target B having an outer diameter of 180 mm and an inner diameter of 140 mm, which is disposed at the periphery of the target A, and a circular partial target C having a diameter of 60 mm disposed at the center of the target A. These targets A, B and C each consist of a material different from those for the other two targets.

Figure 8A:
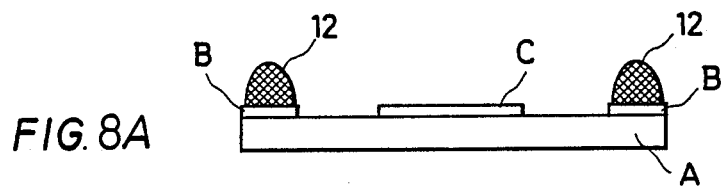
FIGS. 8(a)-8(e) are diagrams illustrating the locations of the plasma 12 observed when a magnetron magnetic field Bm and a magnetic field Bc for compressing are appropriately set to predetermined values in the apparatus shown in FIG. 7.
Figure 8B:
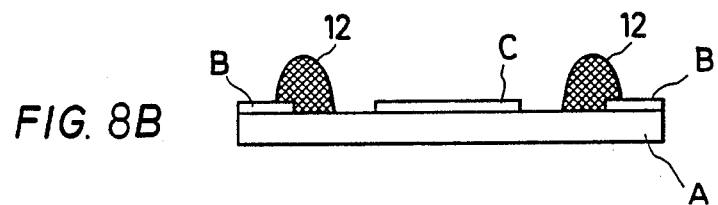
Figure 8C:
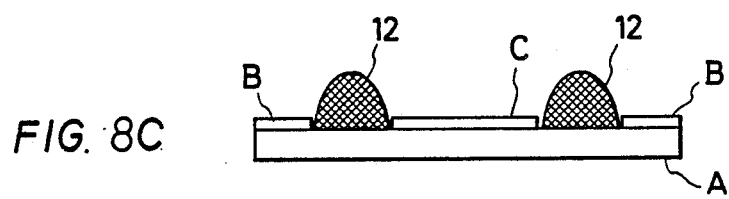
Figure 8D:
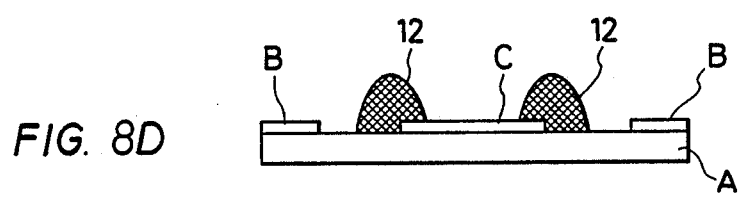
Figure 8E:
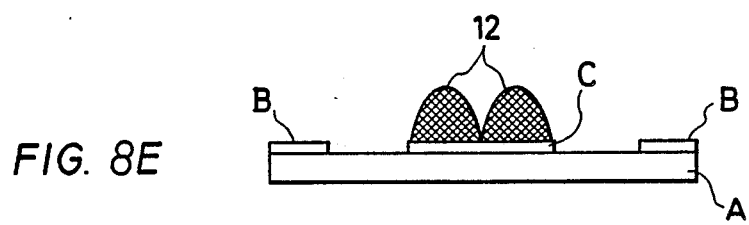

FIG. 8(a) illustrates such a case wherein $Bm = -1200$ G and $Bc = -1750$ G. In this case, the plasma 12 is present only on and above the partial target B in the form of a ring;

FIG. 8(b) illustrates such a case wherein $Bm = -1200$ G and $Bc = -1350$ G. In this case, the plasma 12 is present only on and above the partial targets A and B in the form of a ring;

FIG. 8(c) illustrates such a case wherein $Bm = -1200$ G and $Bc = 0$ G. In this case, the plasma 12 is present only on and above the partial target A in the form of a ring;

FIG. 8(d) illustrates such a case wherein Bm = −1200 G and Bc = +890 G. In this case, the plasma 12 is present only on and above the partial targets A and C in the form of a ring; and FIG. 8(e) illustrates such a case wherein Bm = −1200 G and Bc = +1750 G. In this case, the plasma 12 is present only on and above the partial target C in the form of a ring.

The ring diameter of the plasma 12 is gradually reduced from the case shown in FIG. 8(a) to the case shown in FIG. 8(e). This means that the width of the plasma is sufficiently narrow and the location thereof is thus well controlled.

The sputtering operation in which a desired partial target is used can be performed by controlling the location of the plasma according to the foregoing procedures.

The method for sputtering using the apparatus discussed above, according to the present invention will now be explained hereinbelow.

Figure 9A:
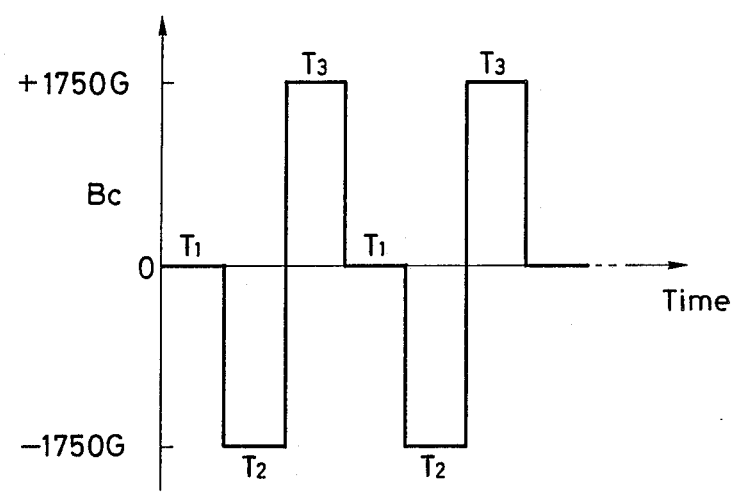
FIG. 9(a) is a diagram illustrating the variation in Bc during forming a multilayer film by repeatedly depositing materials of partial targets A, B and C shown in FIG. 8
Figure 9B:
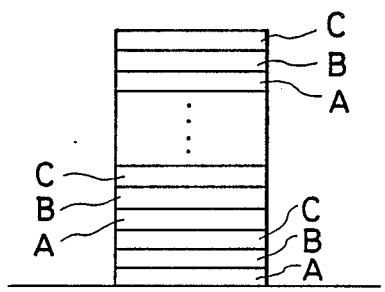
FIG. 9(b) is a diagram showing a construction of the resulting multilayer film.

FIG. 9(a) shows the variation of Bc observed when a multi-layer film is formed by repeatedly depositing materials from the partial targets A, B and C as shown in FIG. 8. In this case, Bm is set to −1200 G and Bc is repeatedly changed stepwise according to the following time schedule: zero G for time $T_1$, −1750 G for time $T_2$; and +1750 G for time $T_3$. FIG. 9(b) shows the construction of the resultant multilayer film.

Figure 10:
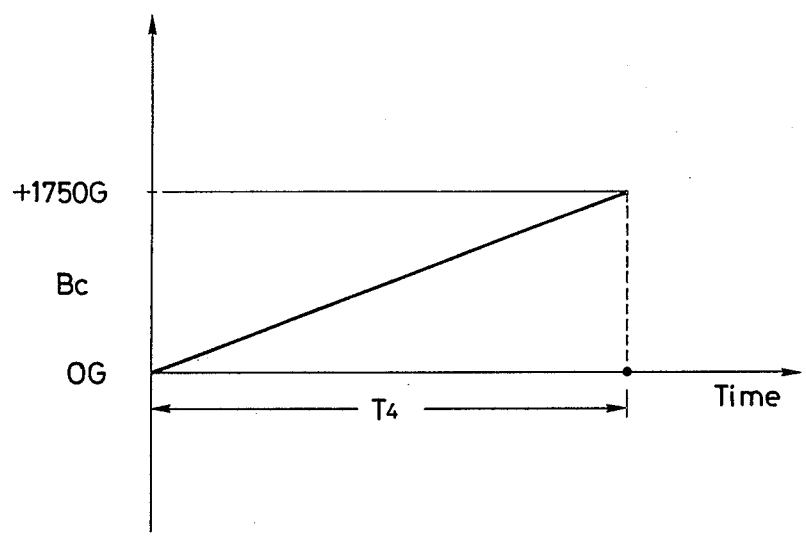
FIGS. 10 and 11 are diagrams illustrating the variation in Bc during forming an alloy film, having a composition which continuously varies in the thicknesswise direction, by depositing materials of partial targets A and C while changing the ratio of the amount of the material for the partial target A to that of the material for the partial target C shown in FIG. 8.

FIG. 10 is a diagram illustrating the variation in Bc during forming an alloy film, having a composition which continuously varies in the thicknesswise direction, by depositing materials of the partial targets A and C while successively changing the ratio of the amount of the material from the partial target A to that of the material from the partial target C as shown in FIG. 8. In this case, Bm is set to −1200 G and Bc is gradually changed, over a time $T_4$, from zero G to +1750 G, whereby the location of the plasma correspondingly moves gradually and thus there is formed a film having a ratio A/C which continuously varies in the thicknesswise direction.

Figure 11:
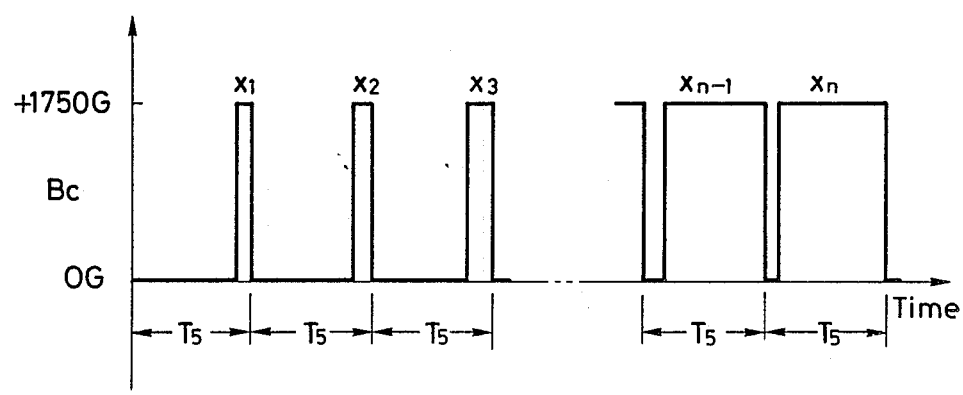

FIG. 11 is likewise a diagram illustrating the variation in Bc during forming an alloy film, having a composition which continuously varies in the thicknesswise direction, by depositing materials of the partial targets A and C while successively changing the ratio of the amount of the material from the partial target A to that of the material from the partial target C shown in FIG. 8. In this case, Bm is set to −1200 G and Bc is periodically changed, i.e., it is initially zero G and is then changed to +1750 G in each cycle which has a period of a constant time $T_5$. While such cycles are repeatedly carried out, the ratio of the time during which Bc is set to zero G to that during which Bc is set to +1750 G is gradually changed, in other words, the time during which Bc is set to +1750 G is gradually increased from $x_1$ to $x_n$. The time $T_5$ is sufficiently short, for instance, a time of the order of 1 to 60 seconds. As a result, though the compositional change corresponding to each pulse is not clearly defined, there is thus formed a film whose composition varies approximately corresponding to the foregoing change in the time ratio.

Alternatively, if such a time ratio is relatively rapidly changed instead of gradually changed, a multilayer film can be formed. Moreover, if the foregoing time ratio is kept constant, a uniform film such as an alloy film composed of a plurality of desired components can be formed.

If a substrate 22 used has a large diameter and only the target A is used, a plasma can be formed by freely selecting any location from the states shown in FIGS. 8(a) to 8(e). Therefore, uniformity of the thickness distribution of a film to be deposited on the surface of the substrate 22 can be improved by selecting at least two locations of the plasma and properly establishing the time ratio (residence time ratio) required for holding the plasma at these locations.

The film-forming method will now be described below with reference to the following Examples.

The following Examples were carried out using the apparatus shown in FIG. 7, the initial magnetic field Bo was set to −10,000 G; the magnetron magnetic field Bm was set to −1,200 G; Ar gas pressure in a vacuum chamber 28 was 10 mTorr and the power for discharge was 600 W.

EXAMPLE 1

Figure 12A:
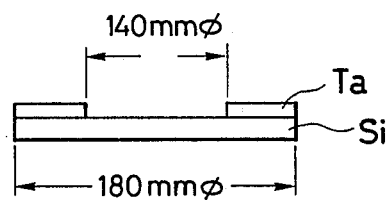
FIG. 12(a) is a diagram showing a target.
Figure 12B:
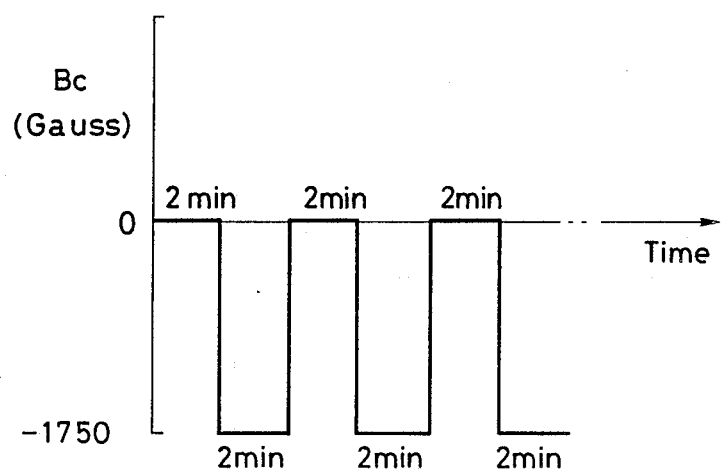
FIG. 12(b) shows the variation in the magnetic field Bc for compressing and FIG. 12(c) is a graph showing the thickness distribution of the resultant film.

A multilayer film was formed on a substrate with the location of the plasma formed being controlled by changing Bc as shown in FIG. 12(b) over 16 minutes, utilizing a target composed of a Si partial target and a Ta partial target as shown in FIG. 12(a).

Figure 12C:
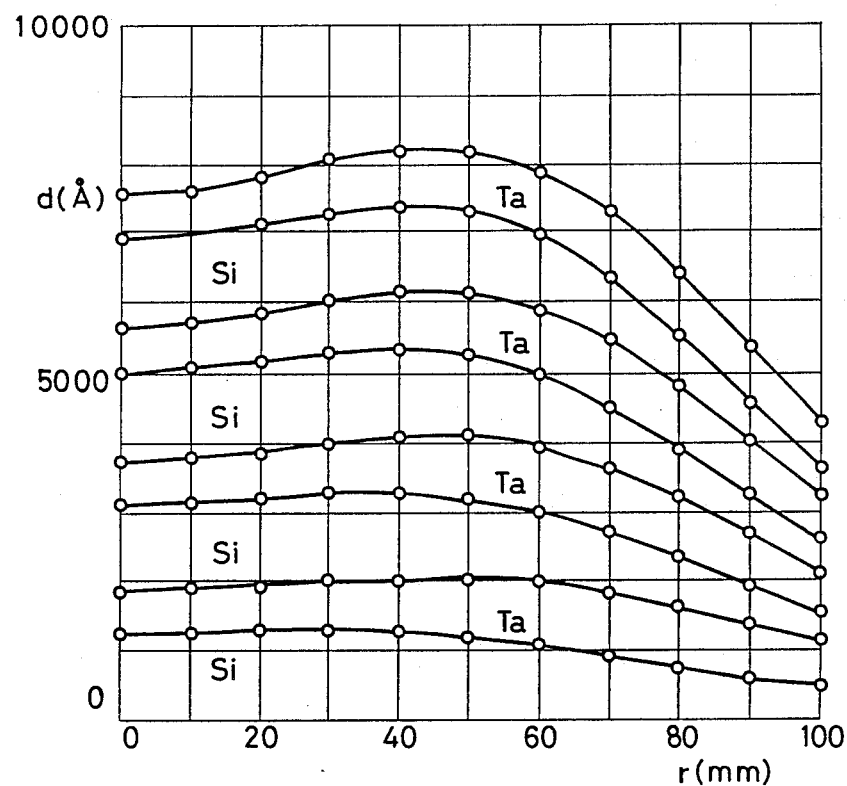

FIG. 12(c) is a graph showing the distribution of the thickness d of each layer of the resultant multilayer film. In the figure, r represents distance from the center of the substrate. As seen from FIG. 12(c), a stacked film having a uniform thickness up to a diameter of about 120 mm was obtained.

EXAMPLE 2

Figure 13A:
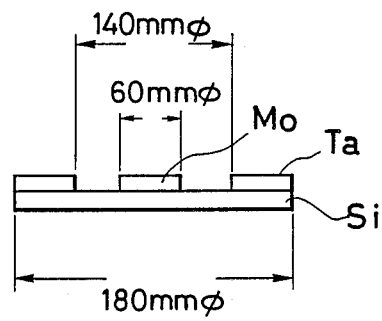
FIG. 13(a) is a diagram showing a target.
Figure 13B:
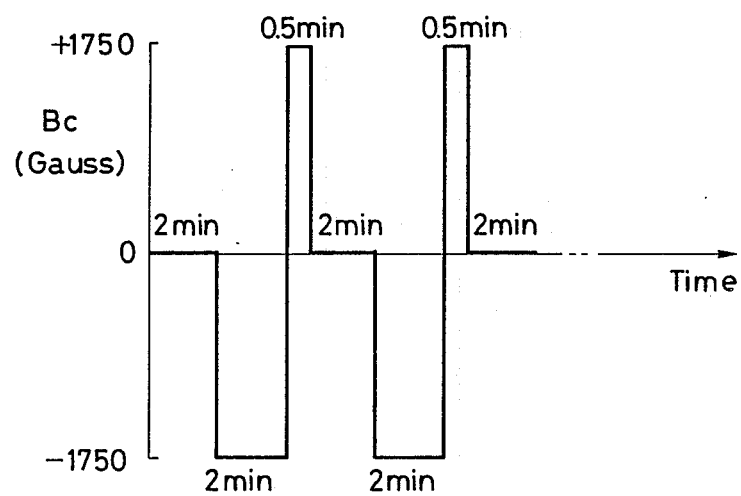
FIG. 13(b) shows the variation in the magnetic field Bc for compressing and FIG. 13(c) is a graph showing the thickness distribution of the resultant film.

A multilayer film was formed on a substrate with the location of the plasma formed being controlled by changing Bc as shown in FIG. 13(b) over 13.5 minutes, utilizing a target composed of Si partial target, a Ta partial target and a Mo partial target as shown in FIG. 13(a).

Figure 13C:
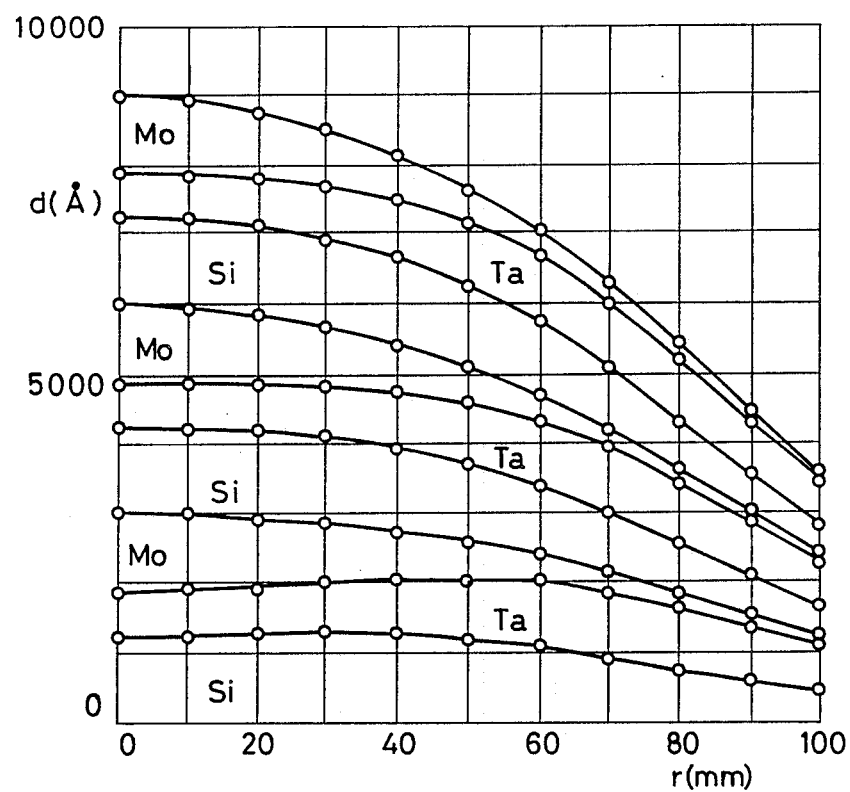

FIG. 13(c) is a graph showing the distribution of the thickness d of each layer of the resultant multilayer film. In the figure, r represents a distance from the center of the substrate. As seen from FIG. 13(c), a stacked film having a uniform thickness up to a diameter of about 70 mm was obtained.

EXAMPLE 3

Figure 14A:
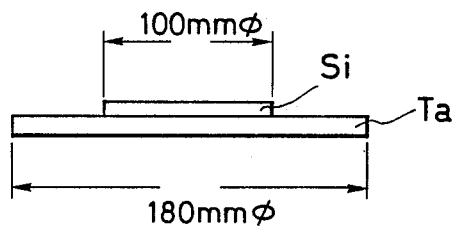
FIG. 14(a) is a diagram showing a target.
Figure 14B:
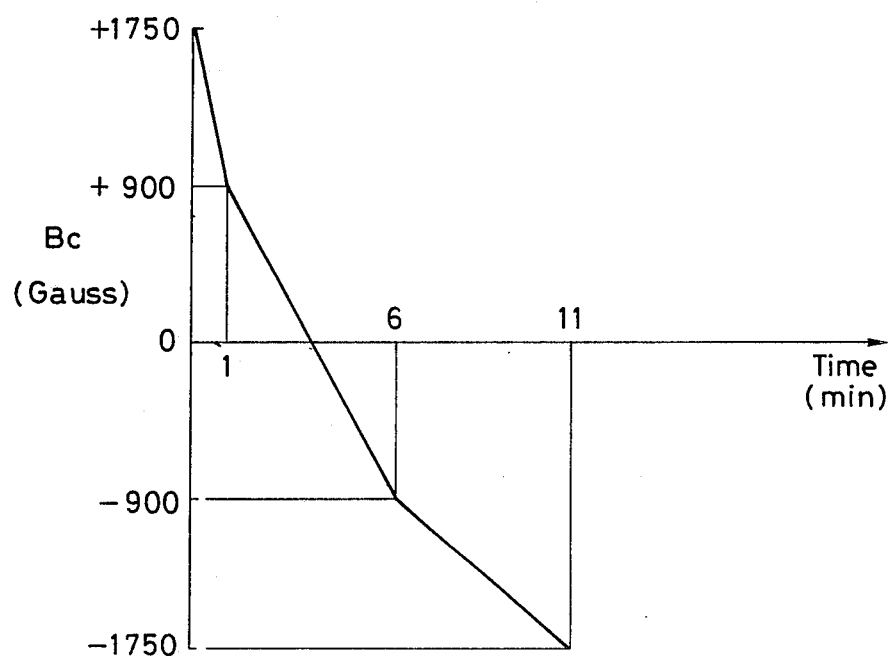
FIG. 14(b) shows the variation in the magnetic field Bc for compressing and FIG. 14(c) is a graph showing the thickness distribution of the resultant film.

A multilayer film was formed on a substrate with the location of the plasma formed being controlled by changing Bc as shown in FIG. 14(b) over 11 minutes, utilizing a target composed of a Si partial target and a Ta partial target as shown in FIG. 14(a).

Figure 14C:
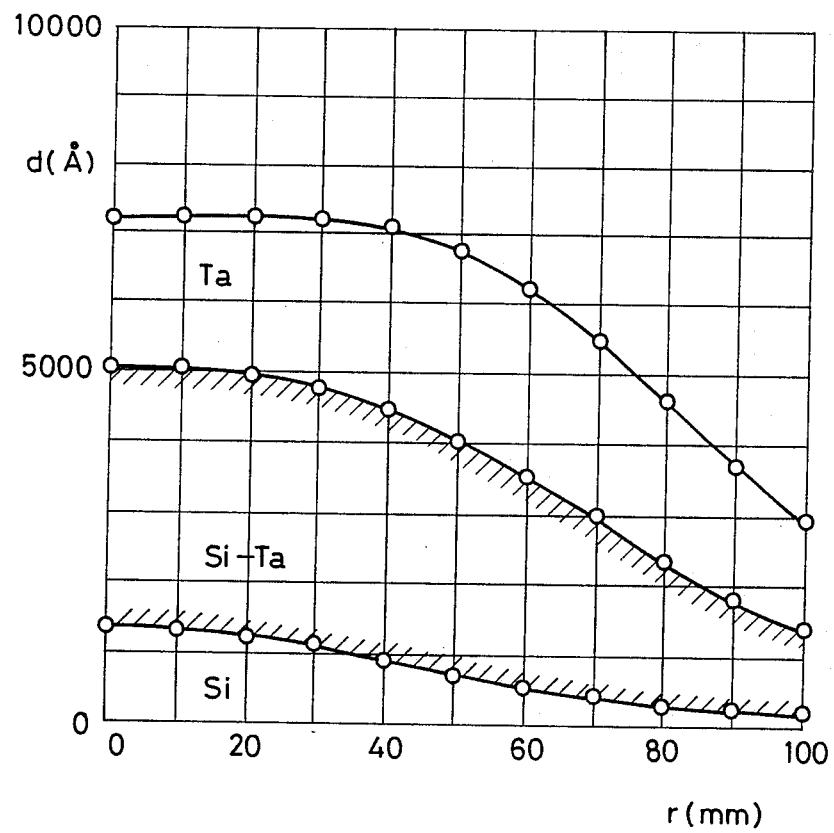

FIG. 14(c) is a graph showing the distribution of the thickness d of each layer of the resultant multilayer film. In this case, the Si-Ta layer is an alloy layer whose Ta content becomes gradually high from the Si layer to the Ta layer. In the figure, r represents distance from the center of the substrate. As seen from FIG. 14(c), a stacked film having a uniform thickness up to a diameter of about 80 mm was obtained.

EXAMPLE 4

Figure 15A:
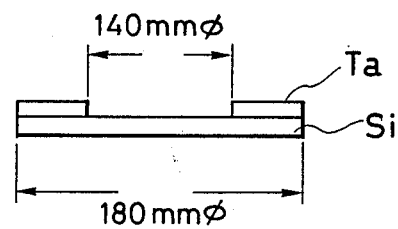
FIG. 15(a) is a diagram showing a target.
Figure 15B:
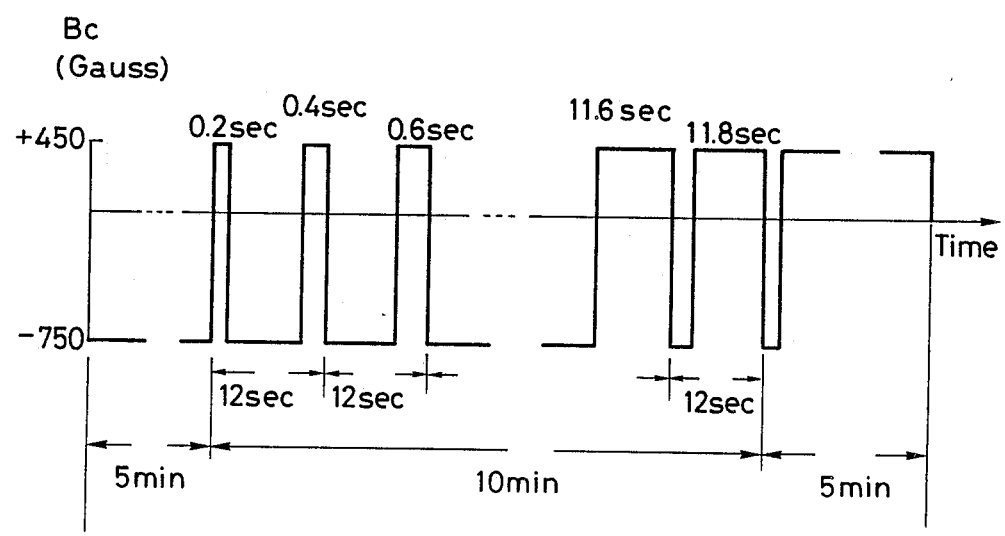
FIG. 15(b) shows the variation in the magnetic field Bc for compressing and FIG. 15(c) is a graph showing the thickness distribution of the resultant film.

A multilayer film was formed on a substrate with the location of the plasma formed being controlled by changing Bc as shown in FIG. 15(b) over 20 minutes, utilizing a target composed of a Si partial target and a Ta partial target as shown in FIG. 15(a).

Figure 15C:
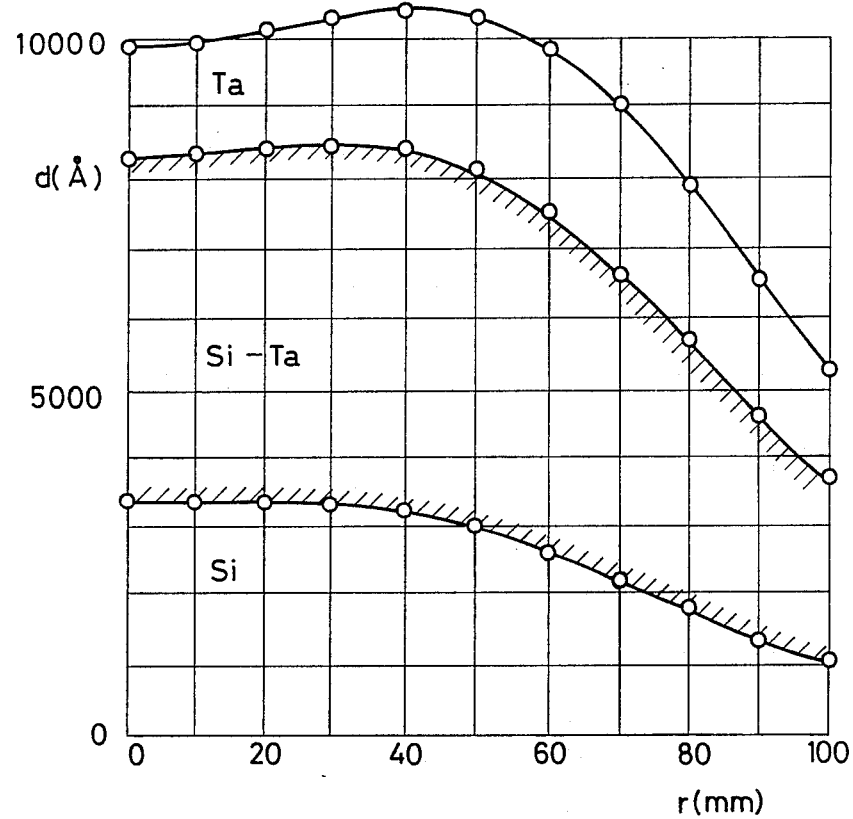

FIG. 15(c) is a graph showing the distribution of the thickness d of each layer of the resultant multilayer film. In this case, the Si-Ta layer is an alloy layer whose Ta content becomes gradually high from the Si layer to the Ta layer. In the figure, r represents distance from the center of the substrate. As seen from FIG. 15(c), a stacked film having a uniform thickness up to a diameter of about 100 mm was obtained.

EXAMPLE 5

Figure 16A:
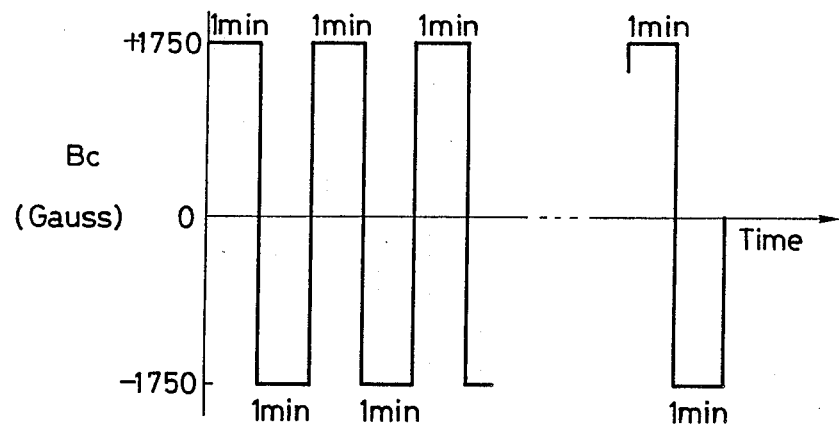
FIG. 16(a) shows the variation in the magnetic field Bc for compressing and FIG. 16(b) is a graph showing the thickness distribution of the resultant film.

A uniform film was formed on a substrate by controlling the location of the plasma by changing Bc as shown in FIG. 16(a) over 14 minutes using a Cu target having a diameter of 180 mm.

Figure 16B:
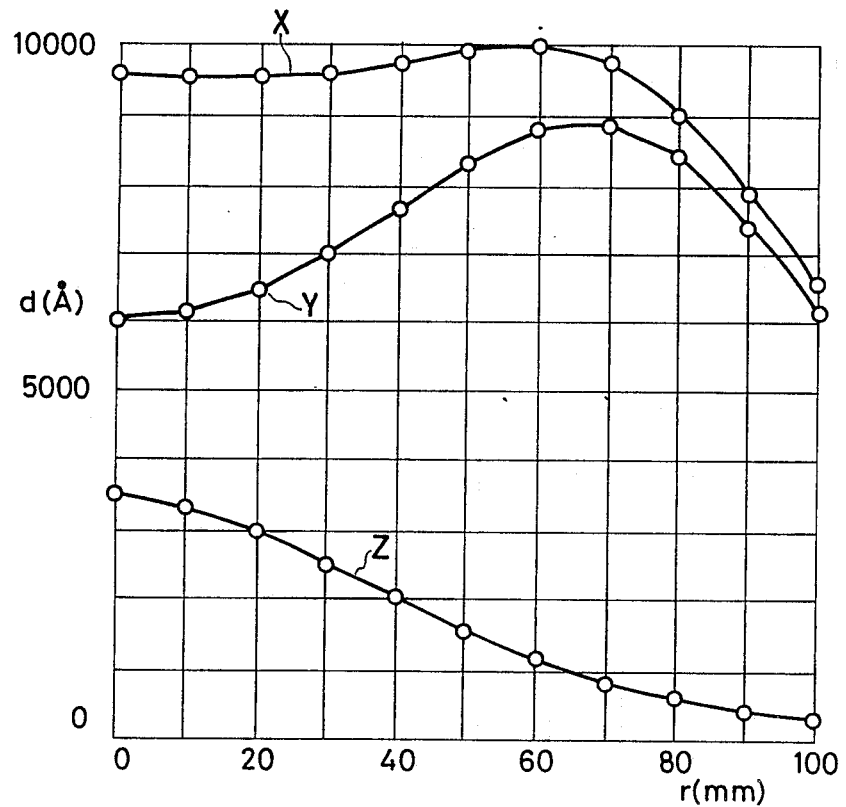

FIG. 16(b) is a graph showing the distribution of the thickness d of the resulting uniform film. In the figure, X is a film formed according to the present invention, Y represents a uniform film (Reference Example) formed on a substrate by depositing at Bc = −1750 G for 7 minutes and Z is a uniform film (Reference Example) formed on a substrate by depositing at Bc = +1750 G for 7 minutes. In the figure, r represents a distance from the center of the substrate. As seen from FIG. 16(b), a stacked film having a uniform thickness up to a diameter of about 160 mm was obtained according to the present invention.

In the foregoing Examples, there are disclosed only the cases wherein Bm is −1,200 G. However, since the magnitude and the direction of the current to be applied to the solenoid coil 16 can be set to any value, the value of Bm can be appropriately selected and set to values other than that shown in FIG. 6.

What is claimed is:

1. A magnetron sputtering apparatus having a sputtering target with a back side and a front side, said front side having a sputtering surface, said apparatus further comprising a magnet structure consisting essential of central magnetic pole and a peripheral magnetic pole, at least one of which is a permanent magnet, said central and peripheral magnetic poles being disposed on said back side of said sputtering target; a first solenoid coil disposed around said central magnetic pole, and a second solenoid coil disposed around said peripheral magnetic pole; said central magnetic pole, said peripheral magnetic pole, and said first and said second solenoid coils forming a magnetic field extending to said front side of said sputtering target; means for changing the magnitude and direction of each current applied to the first and second solenoid coils to continuously vary the radius of a plasma ring formed on the surface of said front side of the sputtering target, to thus contract and expand the plasma ring; and means for setting the magnitude and direction of each current applied to the first and second solenoid coils appropriately to a desired value to maintain the radius of the plasma ring at a desired value for a desired time period.

2. A magnetron sputtering method for depositing films on substrates, which comprises:
providing a magnetron sputtering apparatus for holding a sputtering target and for practicing said method, said magnetron sputtering apparatus having a magnet structure consisting essentially of a central magnetic pole, and a peripheral magnetic pole, at least one of which is a permanent magnet, a first solenoid coil disposed around said central magnetic pole, and a second solenoid coil disposed around said peripheral magnetic pole, said sputtering target being positioned over said central magnetic pole and said peripheral magnetic pole;
using a single target as the sputtering target in the magnetron sputtering apparatus, said single target being of a single composition;
controlling currents to be applied to the first solenoid coil and the second solenoid coil to continuously vary the radius of a plasma ring among a plurality of locations in the radial direction on said sputtering target; and
setting the residence time of the plasma ring at each location of said plurality of locations in the radial direction on said sputtering target to make the thickness distribution of films formed on a substrate uniform.

3. A magnetron sputtering method for depositing films on substrates, which comprises:
providing a magnetron sputtering apparatus for holding a sputtering target and for practicing said method, said magnetron sputtering apparatus having a magnet structure consisting essentially of central magnetic pole and a peripheral magnetic pole, at least one of which is a permanent magnet, a first solenoid coil disposed around said central magnetic pole, and a second solenoid coil disposed around said peripheral magnetic pole, said sputtering target being positioned over said central magnetic pole and said peripheral magnetic pole;
using a composite target having a plurality of partial targets concentrically arranged as the sputtering target in the magnetron sputtering apparatus, each of said partial targets being of a single composition; and
controlling currents to be applied to the first solenoid coil and the second solenoid coil to hold a plasma ring on each partial target of said plurality of partial targets for a time sufficient to form desired layers to thus form a multilayer film on a substrate.

4. A magnetron sputtering method for depositing films on substrates, which comprises:
providing a magnetron sputtering apparatus for holding a sputtering target and for practicing said method, said magnetron sputtering apparatus having a magnet structure consisting essentially of a central magnetic pole and a peripheral magnetic pole, at least one of which is a permanent magnet, a first solenoid coil disposed around said central magnetic pole, and a second solenoid coil disposed around said peripheral magnetic pole, said sputtering target being positioned over said central magnetic pole and said peripheral magnetic pole;
using a composite target having a plurality of partial targets concentrically arranged as the sputtering target in the magnetron sputtering apparatus, each of said partial targets being of a single composition;
controlling currents to be applied to the first solenoid coil and the second solenoid coil to position a plasma ring on the sputtering target extending over two of said plurality of the partial targets; and
moving the plasma ring gradually by varying at least one of said currents so as to obtain films having a composition which gradually varies in the thicknesswise direction of the film.

5. A magnetron sputtering method for depositing films on substrates, which comprises:
providing a magnetron sputtering apparatus for holding a sputtering target and for practicing said method, said magnetron sputtering apparatus having a magnet structure consisting essentially of a central magnetic pole and a peripheral magnetic pole, at least one of which is a permanent magnet, a first solenoid coil disposed around said central magnetic pole, and a second solenoid coil disposed around said peripheral magnetic pole, said sputtering target being positioned over said central magnetic pole and said peripheral magnetic pole;

using a composite target having a plurality of partial targets concentrically arranged as the sputtering target in the magnetron sputtering apparatus, each of said partial targets being of a single composition;

controlling currents to be applied to the first solenoid coil and the second solenoid coil to repeatedly move a plasma ring back and forth between two partial targets of said plurality of partial targets at a fast speed; and changing the ratio of the residence time of the plasma ring on these two partial targets gradually to thus form, on a substrate, a film having a composition which gradually varies in the thicknesswise direction of the film formed.

6. A magnetron sputtering method for depositing films on substrates, which comprises:

providing a magnetron sputtering apparatus for holding a sputtering target and for practicing said method, said magnetron sputtering apparatus having a magnet structure consisting essentially of a central magnetic pole and a peripheral magnetic pole, at least one of which is a permanent magnet, a first solenoid coil disposed around said central magnetic pole, and a second solenoid coil disposed around said peripheral magnetic pole, said sputtering target being positioned over said central magnetic pole and said peripheral magnetic pole;

using a composite target having a plurality of partial targets concentrically arranged as the sputtering target in the magnetron sputtering apparatus, each of said partial targets being of a single composition;

controlling currents to be applied to the first solenoid coil and the second solenoid coil to repeatedly move a plasma ring back and forth between two partial targets of said plurality of partial targets at a fast speed; and changing the ratio of the residence time of the plasma ring on these two partial targets in a stepwise fashion to thus form a multilayer film on a substrate.

7. A magnetron sputtering method for depositing films on substrates, which comprises:

providing a magnetron sputtering apparatus for holding a sputtering target and for practicing said method, said magnetron sputtering apparatus having a magnet structure consisting essentially of a central magnetic pole and a peripheral magnetic pole, at least one of which is a permanent magnet, a first solenoid coil disposed around said central magnetic pole, and a second solenoid coil disposed around said peripheral magnetic pole, said sputtering target being positioned over said central magnetic pole and said peripheral magnetic pole;

using a composite target having a plurality of partial targets concentrically arranged as the sputtering target in the magnetron sputtering apparatus, each of said partial targets being of a single composition;

controlling currents to be applied to the first solenoid coil and the second solenoid coil to repeatedly move a plasma ring back and forth between two partial targets of said plurality of partial targets at a fast speed; and keeping the ratio of the residence time of the plasma ring on these two partial targets constant to thus form a uniform film composed of a plurality of components on a substrate.

* * * * *